United States Patent [19]

Yenisey

[11] Patent Number: 4,471,310

[45] Date of Patent: Sep. 11, 1984

[54] PULSE GENERATOR HAVING VARIABLE PULSE OCCURRENCE RATE

[75] Inventor: Osman M. Yenisey, Manalapan, N.J.

[73] Assignee: AT&T Bell Laboratories, Murray Hill, N.J.

[21] Appl. No.: 336,905

[22] Filed: Jan. 4, 1982

[51] Int. Cl.³ .............................................. H03K 3/78
[52] U.S. Cl. .................................... 328/14; 377/110; 377/33
[58] Field of Search ..................... 328/14; 377/110, 33

[56] References Cited

U.S. PATENT DOCUMENTS

| | | | |
|---|---|---|---|
| 3,184,663 | 5/1965 | Mergler | 318/39 |
| 3,377,469 | 4/1968 | Solomon | 235/92 |
| 3,609,309 | 9/1971 | Arp et al. | 235/92 |
| 3,701,027 | 10/1972 | Belton, Jr. | 328/17 |
| 3,761,824 | 9/1973 | Stark et al. | 328/39 |
| 3,824,379 | 7/1974 | Tomisawa et al. | 235/92 |
| 3,976,945 | 8/1976 | Cox | 328/14 |
| 4,254,327 | 3/1981 | Beno et al. | 235/92 |
| 4,296,380 | 10/1981 | Minakuchi | 328/48 |

*Primary Examiner*—John S. Heyman
*Assistant Examiner*—Nick Biase
*Attorney, Agent, or Firm*—S. R. Williamson

[57] ABSTRACT

A pulse generator circuit provides output pulses that vary in frequency in accordance with a digital input word. An external source frequency produces a predetermined number of pulses over a fixed time interval with the pulse generator circuit selecting the desired number of pulses from those in this interval to provide at its output. Any number of the pulses between zero and the total number in the interval may be selected. To assure their distribution over the interval, the pulses are arranged to occur in sets with the pulses of a given set occurring in the middle of the pulses of another set in order to prevent the bunching of selected pulses into any part of the interval. The sum of the pulses in the combined sets then provides in accordance with the digital input word the desired frequency which ranges up to and includes the source frequency.

20 Claims, 2 Drawing Figures

PULSE GENERATOR HAVING VARIABLE PULSE OCCURRENCE RATE

BACKGROUND OF THE INVENTION

1. Technical Field

This invention relates to pulse generators and, in particular, pulse generators having variable output pulse occurrence rates.

2. Description of the Prior Art

Variable frequency pulse generators are known in the art and have been used heretofore in providing pulse signals with variable repetition intervals. Such signals are generally required in signaling and control operations. The pulse generators in the known art have advantageously used a single high frequency precision oscillator for obtaining a reference frequency. This frequency is divided by an integer reduction factor to obtain the desired decrease in the output frequency. However, deriving multiple frequency outputs that are close together form a pulse generator of this type requires a great increase in the reference frequency. For example, 100 pulses per second may be derived from an oscillator operating at 200 pulses per second; and 101 pulses per second may be derived from another oscillator operating at 202 pulses per second. But to derive both 100 and 101 from the same oscillator by integer division, the oscillator must operate at 10,100 pulses per second minimum which is the least common multiple of the outputs. Thus, the reference oscillator must operate at a much higher frequency, and multiple stages of count reduction circuits are required to obtain in sufficient numbers a reasonable selection of the lower frequencies desired. Such an arrangement has been found satisfactory where the required reference frequency oscillator is within the limitations of available technology, and cost and space requirements for multistage count reducing circuitry is not a consideration. However, in those arrangements desiring high output frequencies, low cost and low power consumption such as is available with CMOS logic, it is desirable to have the source frequency not differ appreciably from the desired frequency, yet still provide a broad range of desired output frequencies.

SUMMARY OF THE INVENTION

In accordance with the invention, there is provided a pulse generator having variable pulse occurrence rates obtained in accordance with a digital input word. The output frequency of the pulse generator is controlled by the digital word and provides a selection of multiple frequency reductions from a source frequency. The number of pulses per second in the output is obtained by reducing the source frequency by a frequency dividing ratio according to the following relationship:

$$f_o = \frac{N - P}{N} f_s$$

where $f_o$ is equal to the output frequency in pulses per second, $f_s$ is equal to the source frequency in pulses per second, N is equal to the number of pulses available in a predetermined time interval, and P is equal to the number of pulses suppressed from the output in the same predetermined time interval and can be any number between 0 and N.

The pulse generator also has variable pulse occurrence rates arrangeable such that selected pulses from the source frequency are provided at the output yielding a frequency dividing ratio according to the following relationship:

$$f_o = \frac{P}{N} f_s$$

where $f_o$ is equal to the output frequency in pulses per second, $f_s$ is equal to the source frequency in pulses per second, N is equal to the number of pulses available in a predetermined time interval and P is equal to the number of pulses allowed to appear at the output in the same predetermined time interval and can also be any number between 0 and N.

The output pulses comprise a selected set of pulses that are derived directly from the source frequency. These pulses have the same width of the source pulses, but intervals between consecutive pulses vary depending on which pulses are selected to appear at the output.

In selecting the order in which the pulses are to occur, consecutive pulses of the source are broken into a number of groups. These groups are selected either to appear or be omitted from the output. To minimize the variations in the intervals of consecutive output pulses caused by the omitted pulses, the pulses are grouped into m sets where $m = \log_2 N$. One pulse is assigned to a first set s(0), two pulses are assigned to a second set s(1) and in general the number ($2^i$) pulses to the set s(i) such that pulses of set s(i) occur in the middle of the pulses of the next set s(i+1). In arranging the pulse selection such that a pulse which is already assigned to a set is never assigned to another, the combination of the sets are made to yield the sum of pulses in the combined sets. The digital word then selects the required binary weighted sets to produce the desired number of output pulses in a specified period.

DETAILED DESCRIPTION

Figure 1:
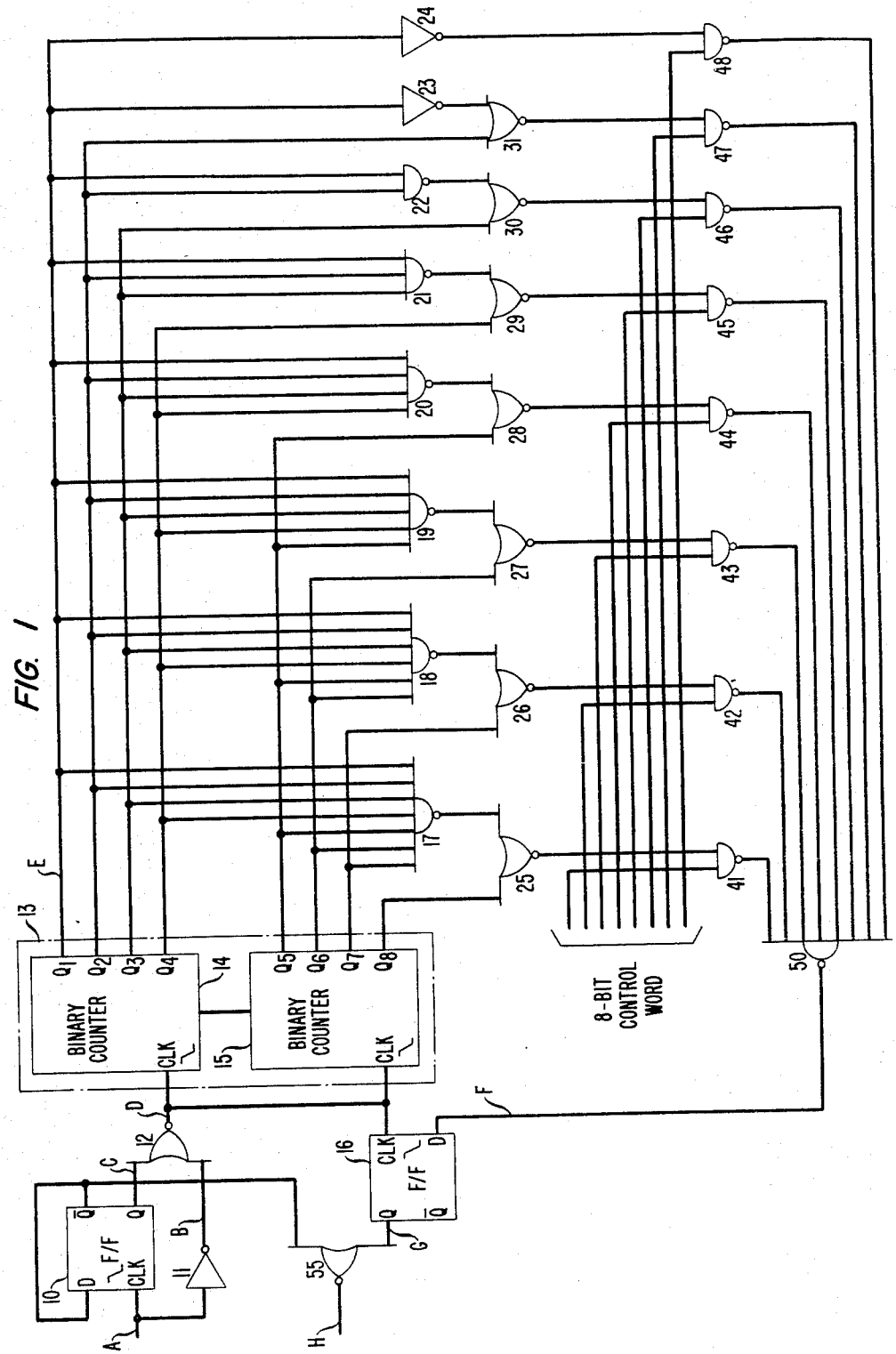
FIG. 1 shows a schematic diagram of a pulse generator in accordance with the invention.
Figure 2:
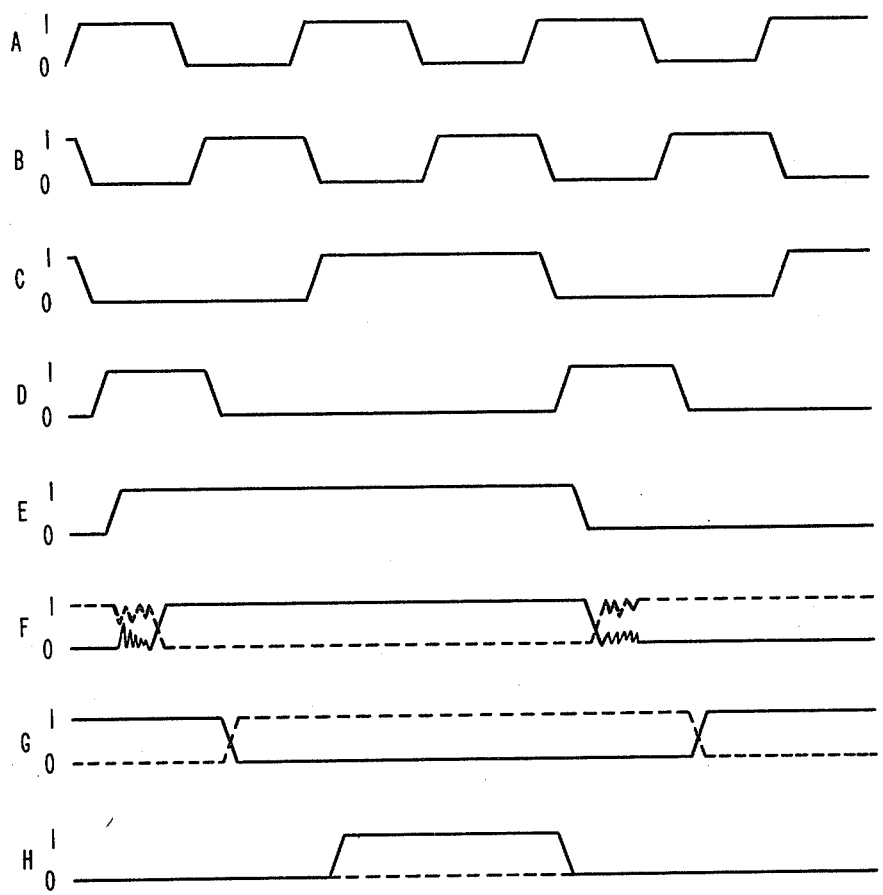
FIG. 2 is a timing diagram depicting waveforms useful in explaining the operation of the pulse generator shown in FIG. 1.

Referring now to FIG. 1 of the drawing, in accordance with the present invention there is shown a schematic diagram of a pulse generator having a variable pulse occurrence rate. The pulse generator can be more easily understood when FIG. 2 and the waveforms depicted thereon are considered in conjunction with FIG. 1.

The output pulses of a precision oscillator (not shown) are applied on input line A to both the input of a D-type flip-flop 10 and an inverter gate 11. A first output of flip-flop 10 provides a series of inverted reference source pulses which are applied to a NOR gate 55 as candidates for the output signal. The other output of flip-flop 10 on line C and the output of inverter gate 11 on line B are combined in NOR gate 12 for providing a source of clock pulses of 25-percent duty cycle on line D. These clock pulses lead the source pulses and are used to allow for proper setup time to decide the disposition of the next source pulse at gate 55. The clock output of NOR gate 12 on line D is coupled both to an eight-stage binary pulse-identifying counter 13 comprising binary counter gates 14 and 15, and to a D-type flip-flop 16 to be later discussed. The number of stages for counter gates 14 and 15 are selected in accordance with the required number of pulses N to yield the desired resolution in the application of the frequency reduction formulas later discussed herein.

Coupled to the output of counter gates 14 and 15 are NAND gates 17 through 22 are inverter gates 23 and 24. Also coupled to the binary counter gates 14 and 15 are two input NOR gates 25 through 31. A first input of each of these NOR gates is coupled to one of the two binary counter gates 14 or 15, and a second input to each of these NOR gates is coupled to the respective outputs of NAND gates 17 through 22 and inverter 23. This arrangement causes the output of gate 25 to be high only once (when the binary count equals 127) for the counting cycle of 0 to 255. Similarly, the outputs of gates 26–31 become high 2, 4, 8, 16, 32, and 64 times respectively for the 256 counts. The output of inverter 24 becomes high 128 times for all even counts of the 256 count cycle.

The outputs of NOR gates 25 through 31 and inverter gate 24 are each combined in a first input of two input NAND gates 41 through 48, respectively. The second input to each of these NAND gates is provided by an eight-bit control word which selectively gates the information present on the first input of each of the NAND gates 41 through 48 onto the inputs of an eight input NAND gate 50. The output of NAND gate 50 becomes high whenever the counter 13 points to a pulse that is allocated to a group selected by the control word. This provides a control signal on line F to the D input of flip-flop 16 which has its clock input connected to the 25-percent duty cycle pulses provided by NOR gate 12. The selection control information on line F is clocked to the outputs Q and $\overline{Q}$ of flip-flop 16, immediately before the occurrence of the designated source pulse. Flip-flop 16 thereby shields the output H from the switching perturbation of the selection circuits.

The outputs of flip-flop 10 and flip-flop 16 on line G are combined in NOR gate 55 for providing the desired output from the pulse generator on line H.

In FIG. 1, the Q output of flip-flop 16 is shown coupled to one of the two inputs of NOR gate 55 on line G. In this arrangement, the pulse generator operates according to the frequency reduction formula $$f_o = \frac{N - P}{N} f_s$$

and P selected pulses are omitted from the output of the pulse generator on line H.

The generator also has the capability of operating in a mode wherein P selected pulses are provided at the output. This is achieved simply by substituting the $\overline{Q}$ output signal connection of flip-flop 16 for the Q output signal connection depicted in FIG. 1 and then using the $\overline{Q}$ output signal to provide the input to the NOR gate 55 from the flip-flop 16. In such an arrangement, the pulse generator operates according to the frequency reduction formula $$f_o = \frac{P}{N} f_s$$

and the selected pulses are provided at the output of the pulse generator.

In the operation of the pulse generator shown in the illustrative embodiment, an eight-stage counter 13 is shown; and 256 consecutive pulses are identifiable as pulses numbered 0 to 255, depending upon the state of the counter. Selected pulses are either allowed to appear in or be suppressed from the output such that during an interval I, over which the 256 pulses occur, the output may contain P pulses where P is equal to 0 through 255. The interval I is usually made equal to an integer exponent of 2 multiplied by the period of each source pulse. A pulse produced by the least significant bit in the counter is shown on line E in FIG. 2.

The selection method of assigning pulses to the output, as practiced in this invention, is to assign equally-spaced pulses to each of m sets and let the pulses of any given set occur in the middle of the pulses of the previous set in order to prevent the bunching of selected pulses in any part of the interval I. As in the depicted embodiment of the invention where an eight-stage binary counter is used, eight sets are formed where set 0 would contain only one pulse, the remaining sets 1 through 7 would contain 2, 4, 8, 16, 32, 64, and 128 pulses, respectively. These sets are then combined to obtain any value from 1 to 255. In mathematical terms, m sets are formed where m=log$_2$N, and set s(i) contains $2^i$ pulses, N being an integer number.

The assignment of a pulse into a particular set is accomplished by means of decoder circuitry comprising NAND gates 17 through 22 and inverters 23 and 24, as well as NOR gates 25 through 31. This decoder circuitry is driven by the pulse identifying counter 13 and is so configured that its output becomes true (logic high) whenever the counter reaches those counts which correspond to the pulses assigned to the set. Selection of the sets is accomplished by gating circuitry comprising NAND gates 41 through 48. These gates block or pass the eight outputs of the decoder circuitry in accordance with the eight-bit control input word to the generator and then selects the appropriately weighted sets in producing the desired number of output pulses.

Although a specific embodiment of the invention has been shown and described, it will be understood that it is but illustrative and that various modifications may be made therein without departing from the scope and spirit of this invention as defined in the appended claims.

What is claimed is:

1. A pulse generator circuit having oscillator input means for providing a reference frequency signal, and an output signal in which the frequency is controlled by an input word, the pulse generator circuit comprising:
   frequency divider means for dividing the frequency of the oscillator signal in accordance with the following formula:

$$f_o = \frac{N - P}{N} f_s$$

where
   $f_o$ = output signal in pulses per second;
   $f_s$ = reference frequency signal in pulses per second;
   N = number of pulses available in a predetermined time interval;
   and
   P = number of pulses removed from N in the predetermined time interval by the frequency divider means;
   means for varying the value P between 0 and N in response to the change in value of the input word; and means for controlling the interval between the pulses in the output signal in response to the value of the input word, the frequency divider means including gating means responsive in combination to the means for controlling the interval between pulses and the reference frequency signal.

2. A pulse generator circuit having oscillator input means for providing a reference frequency signal, and an output signal in which the frequency is controlled by an input word, the pulse generator circuit comprising:

frequency divider means for dividing the frequency of the oscillator signal in accordance with the following formula:

$$f_o = \frac{P}{N} f_s$$

where
$f_o$ = output signal in pulses per second;
$f_s$ = reference signal in pulses per second;
N = number of pulses available in a predetermined time interval;
and
P = number of pulses allowed in N in the predetermined time interval by the frequency divider means;
means for varying the value P between 0 and N in response to the change in value of the input word; and
means for controlling the interval between the pulses in the output signal in response to the value of the input word the frequency divider means including gating means responsive in combination to the means for controlling the interval between pulses and the reference frequency signal.

3. The pulse generator circuit of claim 1 or 2 wherein the frequency divider means comprises a state identifying means responsive to the reference frequency signal, the state identifying means having a plurality of stages for generating a number of distinct states, the number of pulses available in a predetermined time interval further comprising pulses identified by the distinct states of the state identifying means.

4. The pulse generator circuit of claim 3 wherein the state identifying means comprises a counting circuit.

5. The pulse generator circuit of claim 1 or 2 wherein the frequency divider means comprises a counting circuit responsive to the reference frequency signal, the counting circuit having a plurality of stages and generating signals indicative of periodically incrementing information values stored therein.

6. The pulse generator circuit of claim 5 wherein the means for varying the value of P between 0 and N includes means for receiving information values from the counting circuit and for receiving information values from the input word, and means for comparing the information values stored in the counting circuit with the information value of the input word and for detecting a match therebetween, the means for controlling the interval between the pulses being responsive to the detection of the match for distributing a periodic occurrence of pulses in the output signal in accordance with the information value of the input word.

7. The pulse generator circuit of claim 6 wherein the counting circuit includes multiple outputs, each of a first plurality of NAND gates being coupled to at least one of the outputs of the counting circuit for providing an output indication upon the counting circuit attaining a given count, and each of a plurality of inverter gates being coupled to at least one of the outputs of the counting circuit for providing the output indication upon the counting circuit attaining a given count, and each of a plurality of NOR gates being coupled to the output of one of the first plurality of NAND gates and to one of the multiple outputs of the counting circuit.

8. The pulse generator circuit of claim 7 wherein the means for varying the value P includes a second plurality of NAND gates, each of the second plurality of NAND gates having a first input coupled to the output of one of the plurality of NOR gates or to one of the inverter gates, and a second input connected to one of multiple values of the input word.

9. The pulse generator circuit of claim 8 wherein the means for controlling the interval between the pulses include a multiple input NAND gate, and a latch coupled to both the output of the multiple input NAND gate and the reference frequency signal provided by the oscillator input means.

10. The pulse generator circuit of claim 9 further comprising a two-input NOR gate for providing the output signal, the NOR gate having a first input connected to the latch for controlling the interval between the pulses and a second input connected to the reference frequency signal provided by the oscillator input means.

11. A pulse generator circuit having oscillator input means for providing a reference pulse source signal, and an output signal in which the frequency is controlled by an input word, the pulse generator circuit comprising:

frequency reduction means for generating a pulse output signal from the reference pulse source signal in accordance with the following formula:

$$f_o = \frac{N - P}{N} f_s$$

where
$f_o$ = pulsing rate of the output signal;
$f_s$ = pulsing rate of the source signal;
N = number of pulses available from the pulse source in a predetermined time interval;
and
P = number of pulses selected for removal from N in the predetermined time interval by the frequency reduction means;
means for individually identifying N pulses of the reference pulse source; and
means for controlling the selection of P pulses for removal from N pulses in response to the value of the input word, and the frequency reduction means further comprising a first gate responsive in combination to the means for controlling the selection of P pulses and the reference pulse source signal.

12. A pulse generator circuit having oscillator input means for providing a reference pulse source signal, and an output signal in which the frequency is controlled by an input word, the pulse generator circuit comprising:

frequency reduction means for generating a pulse output signal from the reference pulse source signal in accordance with the following formula:

$$f_o = \frac{P}{N} f_s$$

where
$f_o$ = pulsing rate of the output signal;
$f_s$ = pulsing rate of the source signal;

N=number of pulses available from the pulse source in a predetermined time interval;

and

P=number of pulses selected to remain in N in the predetermined time interval by the frequency reduction means;

means for individually identifying N pulses of the reference pulse source; and means for controlling the selection of P pulses for remaining in N pulses in response to the value of the input word, and the frequency reduction means further comprising a first gate responsive in combination to the means for controlling the selection of P pulses and the reference pulse source signal.

13. The pulse generator circuit of claim 11 or 12 wherein the means for individually identifying N pulses of the reference pulse source signal comprises a state identifying means responsive to the reference pulse source signal, the state identifying means having a plurality of stages for generating a number of distinct states, the number of pulses available in a predetermined time interval further comprising pulses identified by the distinct states of the identifying means.

14. The pulse generator circuit of claim 13 wherein the state identifying means comprises a counting circuit.

15. The pulse generator circuit of claim 11 or 12 wherein the means for individually identifying N pulses of the reference pulse source signal comprises means for generating a control signal from the reference pulse signal and a counting circuit responsive to the control signal, the counting circuit having a plurality of stages and generating signals indicative of the identity of the next occurring pulse from the reference pulse signal.

16. The pulse generator circuit of claim 14 wherein the means for controlling the selection of P pulses includes means for receiving information values from the counting circuit and for receiving information values from the input word, and means for comparing the information values stored in the counting circuit with the information value of the input word and for detecting a match therebetween.

17. The pulse generator circuit of claim 15 wherein the information values from the counting circuit comprise multiple counts and wherein the means for controlling the selection of P pulses further comprises means for decoding each of the multiple counts.

18. The pulse generator circuit of claim 17 wherein the means for decoding each of the multiple counts includes a plurality of decoder circuits, a first decoder circuit decoding a one count and a second decoder circuit decoding two counts, and the $m^{th}$ decoder circuit decoding $2^{(m-1)}$ counts.

19. The pulse generator circuit of claim 18 wherein the pulse decoder circuits are coupled in parallel arrangement to the counting circuit, each $m^{th}$ decoder circuit decoding pulses that are an equal number of counts apart from the pulses decoded by the $(m-1)^{th}$ decoder circuit.

20. A pulse generator circuit having oscillator input means for providing a reference frequency signal, and an output signal in which the frequency is controlled by an input word, the pulse generator circuit comprising:

frequency divider means for dividing the frequency of the oscillator signal in accordance with the following formula:

$$f_o = \frac{N-P}{N} f_s$$

where $f_o$ = output signal in pulses per second;

$f_s$ = reference frequency signal in pulses per second;

N = number of pulses available in a predetermined time interval;

and

P = number of pulses removed from N in the predetermined time interval by the frequency divider means;

means for varying the value P between 0 and N in response to the change in value of the input word; and means for controlling the interval between the pulses in the output signal in response to the value of the input word, and the frequency divider means comprising a counting circuit responsive to the reference frequency signal, the counting circuit having a plurality of stages and generating signals indicative of periodically incrementing information values stored therein, the means for varying the value of P between 0 and N including means for receiving information values from the counting circuit and for receiving information values from input word, and means for comparing the information values stored in the counting circuit with the information value of the input word and for detecting a match therebetween, the means for controlling the interval between the pulses being responsive to the detection of the match for distributing a periodic occurrence of pulses in the output signal in accordance with the information value of the input word, the counting circuit including multiple outputs, and each of a first plurality of NAND gates being coupled to at least one of the outputs of the counting circuit for providing an output indication upon the counting circuit attaining a given count, and each of a plurality of inverter gates being coupled to at least one of the outputs of the counting circuit for providing the output indication upon the counting attaining a given count, and each of a plurality of NOR gates being coupled to the output of one of the first plurality of NAND gates and to one of the multiple outputs of the counting circuit, and the means for varying the value P includes a second plurality of NAND gates, each of the second plurality of NAND gates having a first input coupled to the output of one of the plurality of NOR gates or to one of the inverter gates, and a second input connected to one of multiple values of the input word.

* * * * *

UNITED STATES PATENT AND TRADEMARK OFFICE
CERTIFICATE OF CORRECTION

PATENT NO. : 4,471,310
DATED : September 11, 1984
INVENTOR(S) : Osman M. Yenisey It is certified that error appears in the above—identified patent and that said Letters Patent is hereby corrected as shown below:

Column 1, line 21, "form" should read --from--.

Column 6, line 20, "claim 9" should read --claim 9 or 20--.

Signed and Sealed this

Thirtieth Day of April 1985

[SEAL]

Attest:

DONALD J. QUIGG

Attesting Officer    Acting Commissioner of Patents and Trademarks